United States Patent
Il et al.

(10) Patent No.: US 9,231,184 B2
(45) Date of Patent: *Jan. 5, 2016

(54) PIEZOELECTRIC RESONATOR ELEMENT AND PIEZOELECTRIC RESONATOR

(71) Applicant: Seiko Epson Corporation, Tokyo (JP)

(72) Inventors: Toshihiro Il, Kamiina (JP); Kenji Komine, Hamanogo (JP); Matsutaro Naito, Kamiina (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/250,696

(22) Filed: Apr. 11, 2014

(65) Prior Publication Data

US 2014/0217856 A1    Aug. 7, 2014

Related U.S. Application Data

(63) Continuation of application No. 13/252,594, filed on Oct. 4, 2011, now Pat. No. 8,766,514.

(30) Foreign Application Priority Data

Nov. 19, 2010  (JP) .................. 2010-259177

(51) Int. Cl.
*H03H 9/19* (2006.01)
*H01L 41/08* (2006.01)
(Continued)

(52) U.S. Cl.
CPC ............... *H01L 41/08* (2013.01); *H03H 3/02* (2013.01); *H03H 9/02023* (2013.01); *H03H 9/177* (2013.01); *H03H 9/19* (2013.01); *H03H 9/0509* (2013.01); *H03H 9/1021* (2013.01)

(58) Field of Classification Search
CPC ......... H03H 9/05; H03H 9/0504; H03H 9/10; H03H 9/1007; H03H 9/1021; H03H 9/15; H03H 9/17; H03H 9/19; H03H 9/21
See application file for complete search history.

(56) References Cited

U.S. PATENT DOCUMENTS 6,191,524 B1   2/2001   Sasaki et al.
7,518,294 B2   4/2009   Umetsu
(Continued)

FOREIGN PATENT DOCUMENTS

EP   1780890 A2    5/2007
JP   58-047316     3/1983
(Continued)

OTHER PUBLICATIONS

Goka et al., "Decoupling Effect of Multi-stepped Bi-mesa AT-cut Quartz Resonators", 2003.*

(Continued)

*Primary Examiner* — Derek Rosenau
(74) *Attorney, Agent, or Firm* — Harness, Dickey & Pierce, P.L.C.

(57) ABSTRACT

A piezoelectric resonator element includes a piezoelectric substrate formed of an AT-cut quartz crystal substrate in which the thickness direction thereof is a direction parallel to the Y' axis; and excitation electrodes disposed so as to face vibrating regions on both front and rear principal surfaces of the piezoelectric substrate. The piezoelectric substrate includes a rectangular excitation portion in which sides parallel to the X axis are long sides thereof, and sides parallel to the Z' axis are short sides thereof; and a peripheral portion having a smaller thickness than the excitation portion and formed around the excitation portion. Each of side surfaces of the excitation portion extending in a direction parallel to the X axis is present in one plane, and each of side surfaces of the excitation portion extending in a direction parallel to the Z' axis has a step.

20 Claims, 13 Drawing Sheets

(51) Int. Cl.
*H03H 3/02* (2006.01)
*H03H 9/02* (2006.01)
*H03H 9/17* (2006.01)
H03H 9/05 (2006.01)
H03H 9/10 (2006.01)

(56) References Cited

U.S. PATENT DOCUMENTS

| | | | |
|---|---|---|---|
| 2003/0111935 A1 | 6/2003 | Akane et al. | |
| 2004/0095044 A1 | 5/2004 | Yagishita | |
| 2005/0258146 A1 | 11/2005 | Umetsu | |
| 2007/0096596 A1 | 5/2007 | Naito et al. | |
| 2011/0203083 A1* | 8/2011 | Sasaki et al. | 29/25.35 |

FOREIGN PATENT DOCUMENTS

| | | |
|---|---|---|
| JP | 02-057009 | 2/1990 |
| JP | 06-052230 | 7/1994 |
| JP | 10-308645 | 11/1998 |
| JP | 2001-077647 A | 3/2001 |
| JP | 2001-230655 A | 8/2001 |
| JP | 2005-159717 A | 6/2005 |
| JP | 2005-318477 A | 11/2005 |
| JP | 3731348 B2 | 1/2006 |
| JP | 2007-189492 A | 7/2007 |
| JP | 4075893 B2 | 4/2008 |
| JP | 2008-236439 A | 10/2008 |
| JP | 2008-263387 A | 10/2008 |
| JP | 2009-130543 A | 6/2009 |
| JP | 4341583 B2 | 10/2009 |
| JP | 2010-062723 A | 3/2010 |
| JP | 2010-109527 A | 5/2010 |

OTHER PUBLICATIONS

Goka, Shigeyoshi, "A Study on Improvement of Properties of AT-Cut Quartz Resonator Having Mesa Structure", Tokyo Metropolitan University, Mar. 2005, pp. 1-120 (with English translation).

Goka et al.;: Mode Decoupling Effect of Multistepped Bi-Mesa AT-Cut Quartz; Japanese Journal of Applied Physics; vol. 43; No. 5B; pp. 3016-3019; May 28, 2004.

Extended European Search Report for Application No. 11 18 9519 mailed on Mar. 30, 2012 (9 pages).

Goka, S. et al, "Decoupling Effect of Stepped Mesa Structures on Spurious Vibrations of At-Cut Quartz Plates", Frequency Control Symposium and Exhibition, 2000. Proceedings of the 2000 IEEE/EIA International, Jun. 7-9, 2000, Piscataway, NJ, IEEE, Jan. 1, 2000, pp. 397-400.

Shen, F. et al., "Energy Trapping in Mesa-Shaped Quartz Crystal Microbalance", Proceedings of IEEE Sensors 2002, Orlando, Fl, Jun. 12-14, 2002, IEEE International Conference on Sensors, New York, NY, IEEE, U.S., vol. 2, Jun. 12, 2002, pp. 1154-1159.

\* cited by examiner

PIEZOELECTRIC RESONATOR ELEMENT AND PIEZOELECTRIC RESONATOR

CROSS-REFERENCE TO RELATED APPLICATIONS

This is a continuation application of U.S. application Ser. No. 13/252,594 filed Oct. 4, 2011, which claims priority to Japanese Patent Application No. 2010-259177, filed Nov. 19, 2010 all of which are expressly incorporated by reference herein in their entireties.

BACKGROUND

1. Technical Field

The present invention relates to a piezoelectric resonator element and a piezoelectric resonator.

2. Related Art

AT-cut piezoelectric resonator elements use a thickness-shear vibration mode which is ideal for obtaining excellent temperature properties as their primary vibration mode. Such an AT-cut resonator element is processed by mechanical processing or photolithography.

JP-A-58-47316 discloses a piezoelectric resonator that vibrates in a so-called mesa-type thickness-shear vibration mode where an energy-trapping effect equivalent to a bevel or convex structure is obtained.

In recent years, there is a strong tendency to decrease the size of resonator elements, and there is a strong demand for a resonator having a small side ratio. In general, a resonator having a small side ratio is likely to be affected by a mode (contour vibration mode) associated with the contour of the resonator, and a thickness-shear mode is suppressed by being coupled to the contour vibration mode.

JP-UM-A-6-52230 discloses a mesa-type AT-cut quartz crystal resonator which is designed so as to solve a problem where in the boundary between a mesa portion and a thin peripheral portion, if the lateral walls of the boundary portion are at 90° to the primary surface, extraction electrodes (lead electrodes) extended from excitation electrodes are short-circuited. In the AT-cut quartz crystal resonator, the lateral walls of the boundary portion are configured as sloped or curved surfaces so as to prevent short-circuiting of the lead electrodes.

JP-A-2001-230655 discloses a mesa-type AT-cut quartz crystal resonator in which coupling of a thickness-shear vibration mode which is a primary vibration mode and a flexural vibration mode is suppressed by configuring the lateral walls of the boundary between a mesa portion and a thin peripheral portion so as to be sloped at 63° and 35° rather than being vertical (90°).

Japanese Patent No. 4341583 discloses a structure in which coupling of a thickness-shear mode and a flexural mode is suppressed by appropriately setting the mesa dimensions and the distance between mesa electrodes which are associated with the flexural vibration mode which is a contour vibration mode.

JP-A-2008-263387 discloses a mesa-type AT-cut quartz crystal resonator in which a spurious mode is suppressed by appropriately setting the amount of etching of a step.

JP-A-2010-62723 discloses a mesa-type AT-cut quartz crystal resonator in which a spurious mode is suppressed by appropriately setting the short side length of a piezoelectric substrate and the short side length of a vibrating portion.

JP-A-2-57009 discloses a structure in which vibration energy in primary vibration mode is effectively trapped by forming a mesa portion with multiple steps.

Japanese Patent No. 3731348 discloses a resonator of which the cross section has a staircase shape, which can be formed by chemical processing such as etching or mechanical processing such as sand blast while gradually changing the dimensions of a resist covering the resonator portion during manufacturing.

JP-A-2008-236439 discloses a structure in which the step between a thick central portion and a thin peripheral portion is formed in a staircase shape with plural steps, whereby it is easy to form the shape of a resist pattern, and to deposit an electrode material to a sufficient thickness, and make the thick central portion have a convex shape, thus enhancing an energy trapping effect.

JP-A-2009-130543 discloses a multi-step mesa-type resonator element in which entry of a conductive adhesive agent into a mesa portion is suppressed by a step which is used as a stopper for the adhesive agent.

JP-A-2010-109527 discloses a multi-step mesa structure which is precisely formed by etching a base material made of a quartz crystal using photolithography.

Japanese Patent No. 4075893 discloses a method of manufacturing a multi-step mesa-type AT-cut quartz crystal resonator in which a mesa structure is formed using a laser.

As described above, JP-A-2-57009, Japanese Patent No. 3731348, JP-A-2008-236439, JP-A-2009-130543, JP-A-2010-109527, and Japanese Patent No. 4075893 disclose a multi-step mesa structure in which the number of mesa steps is increased as a structure for suppressing coupling with a flexural mode through a strong energy trapping effect.

However, in a multi-step mesa-type thickness-shear-mode piezoelectric resonator element in which the extending direction of the longer side is parallel to the X axis, particularly in a piezoelectric resonator element in which the X-side ratio is small, it is obvious that a thickness-shear vibration mode couples to a spurious mode such as a contour vibration mode, and the CI (Crystal Impedance) value increases.

SUMMARY

An advantage of some aspects of the invention is that it provides a piezoelectric resonator element which has a multi-step mesa structure and which can decrease the CI value. Another advantage of some aspects of the invention is that it provides a piezoelectric resonator having the piezoelectric resonator element.

An aspect of the invention is directed to a piezoelectric resonator element including: a piezoelectric substrate formed of an AT-cut quartz crystal substrate in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a −Y direction of the Y axis about the X axis is a Z' axis, and an axis which is the Y axis tilted in a +Z direction of the Z axis about the X axis is a Y' axis, in which the AT-cut quartz crystal substrate is configured by a plane parallel to the X axis and the Z' axis, and the thickness direction thereof is a direction parallel to the Y' axis; and excitation electrodes disposed so as to face vibrating regions on both front and rear principal surfaces of the piezoelectric substrate, wherein the piezoelectric substrate includes a rectangular excitation portion in which sides parallel to the X axis are long sides thereof, and sides parallel to the Z' axis are short sides thereof; and a peripheral portion having a smaller thickness than the excitation portion and formed around the excitation portion, wherein each of side surfaces of the excitation portion extending in a direction parallel to the X axis is present in one plane, and wherein each of side surfaces of the excitation portion extending in a direction parallel to the Z' axis has a step.

According to such a piezoelectric resonator element, it is possible to prevent coupling of a thickness-shear mode and a spurious mode such as a contour vibration mode in a direction parallel to the Z' axis and to decrease the CI value (details will be described later).

In the piezoelectric resonator element of the above aspect, when the length of the piezoelectric substrate in a direction parallel to the Z' axis is Z, the short side length of the excitation portion is Mz, and the thickness of the excitation portion is t, a relation of $8 \leq Z/t \leq 11$ and $0.6 \leq Mz/Z \leq 0.8$ may be satisfied.

According to such a piezoelectric resonator element, it is possible to further decrease the CI value.

In the piezoelectric resonator element of the above aspect, when the length of the piezoelectric substrate in a direction parallel to the X axis is X, a relation of $X/t \leq 17$ may be satisfied.

According to such a piezoelectric resonator element, it is possible to decrease the CI value while realizing miniaturization.

In the piezoelectric resonator element of the above aspect, the excitation portion may include a first portion and second portions having a smaller thickness than the first portion, and the steps of the side surfaces extending in the Z'-axis direction may be formed by a difference in the thickness of the first and second portions.

According to such a piezoelectric resonator element, it is possible to decrease the CI value.

In the piezoelectric resonator element of the above aspect, the excitation portion may further include third portions having a smaller thickness than the second portions, and the steps of the side surfaces extending in the Z'-axis direction may be formed by a difference in the thickness of the first, second, and third portions.

According to such a piezoelectric resonator element it is possible to provide a stronger energy trapping effect.

Another aspect of the invention is directed to a piezoelectric resonator including: the piezoelectric resonator element of the above aspect; and a package in which the piezoelectric resonator element is accommodated.

According to such a piezoelectric resonator, since it includes the piezoelectric resonator element of the above aspect, it is possible to decrease the CI value.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, several embodiments of the invention will be described. The embodiments described herein illustrate examples of the invention. The invention is not limited to the following embodiments and includes various modified examples embodied without departing from the spirit of the invention. It should be noted that not all of the configurations described in the following embodiments are essential to the invention.

1. Piezoelectric Resonator Element

Figure 1:
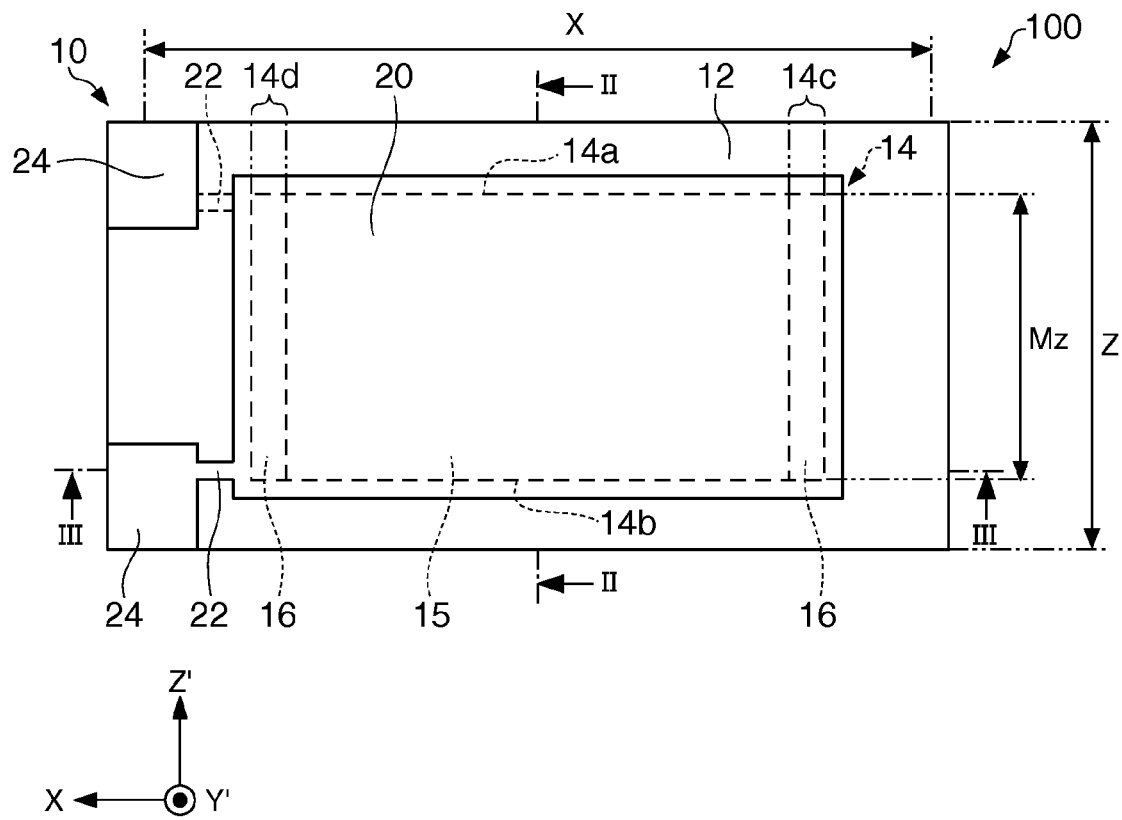
FIG. 1 is a planar view schematically showing a piezoelectric resonator element according to an embodiment of the invention.
Figure 2:
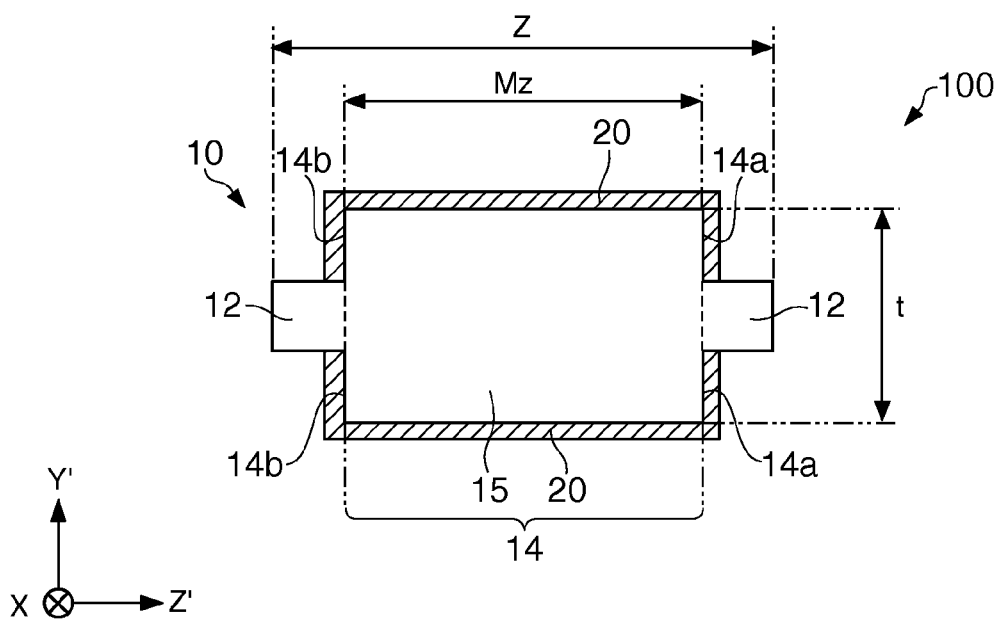
FIG. 2 is a cross-sectional view schematically showing the piezoelectric resonator element according to the embodiment.
Figure 3:
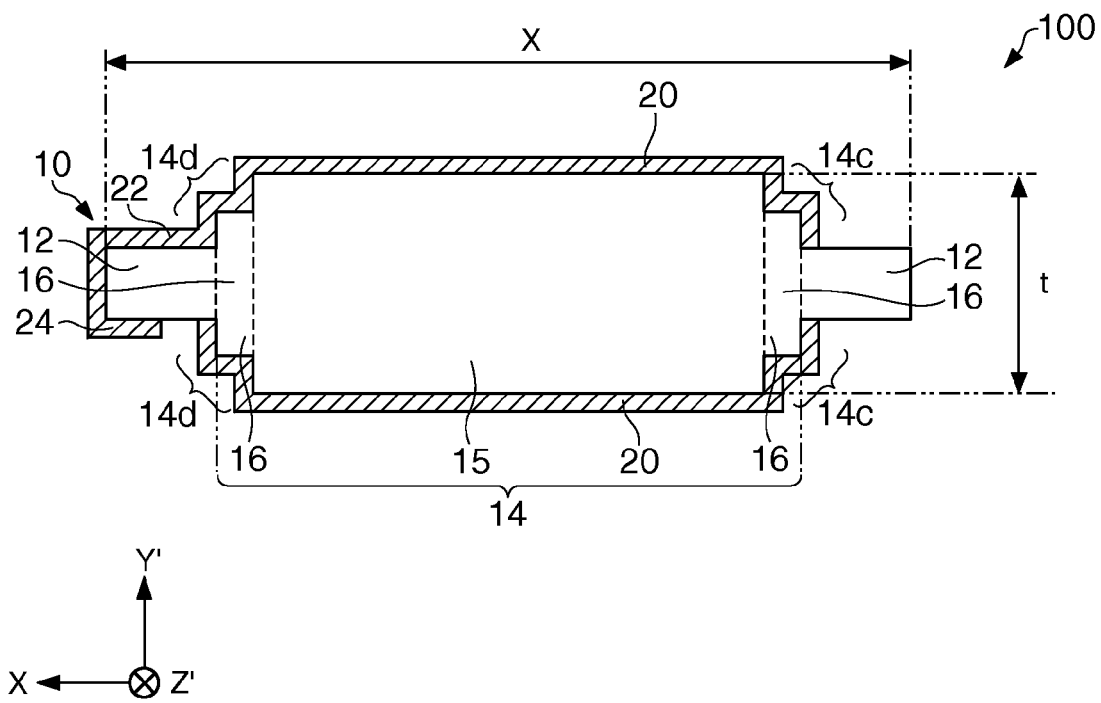
FIG. 3 a cross-sectional view schematically showing the piezoelectric resonator element according to the embodiment.

First, a piezoelectric resonator element according to an embodiment of the invention will be described with reference to the relevant drawings. FIG. 1 is a planar view schematically showing a piezoelectric resonator element 100 according to an embodiment of the invention. FIGS. 2 and 3 are cross-sectional views schematically showing the piezoelectric resonator element 100 according to the embodiment. FIG. 2 is a cross-sectional view taken along the line II-II in FIG. 1, and FIG. 3 is a cross-sectional view taken along the line III-III in FIG. 1.

As shown in FIGS. 1 to 3, the piezoelectric resonator element 100 includes a piezoelectric substrate 10 and excitation electrodes 20.

Figure 4:
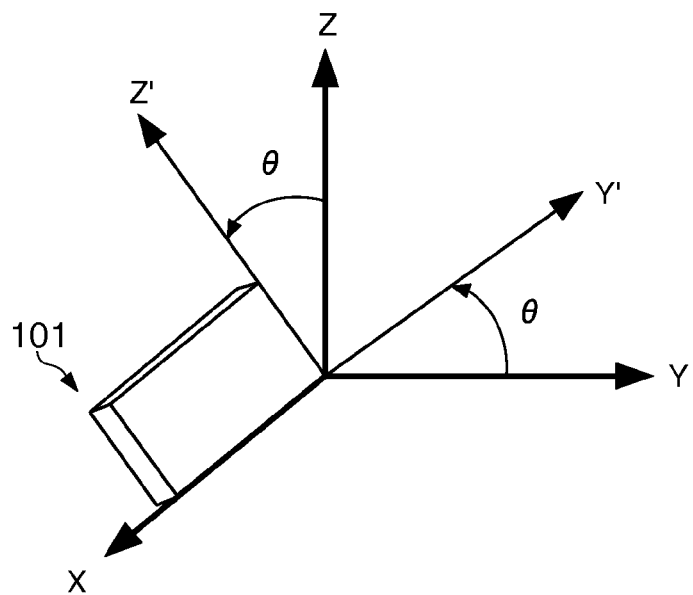
FIG. 4 is a perspective view schematically showing an AT-cut quartz crystal substrate.

The piezoelectric substrate 10 is formed of an AT-cut quartz crystal substrate. FIG. 4 is a perspective view schematically showing the AT-cut quartz crystal substrate 101.

A piezoelectric material such as a quartz crystal is generally a trigonal system and has crystal axes (X, Y, and Z) as shown in FIG. 4. The X axis is an electrical axis, the Y axis is a mechanical axis, and the Z axis is an optical axis. The AT-cut quartz crystal substrate 101 is a planar substrate which obtained by cutting the XZ plane from a piezoelectric material (for example, a synthetic quartz crystal) along a plane rotated at an angle of θ around the X axis. Here, θ=35.15°. Here, the Y and Z axes rotated by the angle θ around the X axis will be referred to as a Y' axis and a Z' axis, respectively. Thus, the AT-cut quartz crystal substrate 101 has crystal axes (X, Y', and Z'). The AT-cut quartz crystal substrate 101 has its principal surface (excitation plane) on the XZ' plane (a plane including the X and Z' axes) orthogonal to the Y' axis and can vibrate in a thickness-shear mode as its primary vibration mode. The piezoelectric substrate 10 can be obtained by processing the AT-cut quartz crystal substrate 101.

That is, as shown in FIG. 4, the piezoelectric substrate 10 is formed of an AT-cut quartz crystal substrate in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a –Y direction of the Y axis about the X axis is a Z' axis, and an axis which is the Y axis tilted in a +Z direction of the Z axis about the X axis is a Y' axis, in which the AT-cut quartz crystal substrate is configured by a plane parallel to the X axis and the Z' axis, and the thickness direction thereof is a direction parallel to the Y' axis.

As shown in FIG. 1, the piezoelectric substrate 10 can have a rectangular shape in which the thickness direction is a direction (hereinafter referred to as a "Y'-axis direction") parallel to the Y' axis, a long side direction thereof is a direction (hereinafter referred to as an "X-axis direction") parallel to the X axis, and a short side direction thereof is a direction (hereinafter referred to as a "Z'-axis direction") parallel to the Z' axis. The piezoelectric substrate 10 includes a peripheral portion 12 and an excitation portion 14.

As shown in FIG. 1, the peripheral portion 12 is formed around the excitation portion 14. The peripheral portion 12 has a smaller thickness than the excitation portion 14.

As shown in FIG. 1, the excitation portion 14 is surrounded by the peripheral portion 12 and has a larger thickness than the thickness of the peripheral portion 12 in the Y'-axis direction. That is, as shown in FIGS. 2 and 3, the excitation portion 14 protrudes in the Y'-axis direction in relation to the peripheral portion 12. In the example shown, the excitation portion 14 protrudes in the +Y' and –Y' axis sides in relation to the peripheral portion 12. The excitation portion (the piezoelectric substrate 10) has a point (not shown) serving as the center of symmetry and can have a shape that is symmetrical with respect to the point.

As shown in FIG. 1, the excitation portion 14 has a rectangular shape in which a long side direction is the X-axis direction, and a short side direction is the Z'-axis direction. That is, the sides of the excitation portion 14 parallel to the X axis are the long sides, and the sides thereof parallel to the Z'-axis direction are the short sides. Thus, the excitation portion 14 has side surfaces 14a and 14b extending in the X-axis direction and side surfaces 14c and 14d extending in the Z'-axis direction. That is, the longitudinal direction of the side surfaces 14a and 14b extending in the X-axis direction is the X-axis direction, and the longitudinal direction of the side surfaces 14c and 14d extending in the Z'-axis direction is the Z'-axis direction. In the example shown, among the side surfaces 14a and 14b, the side surface 14a is a side surface on the +Z' side, and the side surface 14b is a side surface on the –Z' side. Moreover, among the side surfaces 14c and 14d, the side surface 14c is a side surface on the –X side, and the side surface 14d is a side surface on the +X side.

For example, the side surface 14a extending in the X-axis direction is formed on the +Y' and –Y' sides in relation to the peripheral portion 12 as shown in FIG. 2. The same is applied to the side surfaces 14b, 14c, and 14d. The side surfaces 14a and 14b extending in the X-axis direction are present on one plane as shown in FIG. 2. That is, the side surface 14a on the +Y' side is present in one plane, and the side surface 14a on the –Y' side is present in one plane. Similarly, the side surface 14b on the +Y' side is present in one plane, and the side surface 14b on the –Y' side is present in one plane.

In the description of the invention, the expression "being in one plane" includes a case where the side surface of the excitation portion 14 is a flat surface and a case where the side surface has an uneven surface associated with crystalline anisotropy of a quartz crystal. That is, when an AT-cut quartz crystal substrate is processed using a solution containing a hydrofluoric acid as an etching solution, the side surface of the excitation portion 14 may be the R-surface of a crystalline quartz crystal which is exposed to the outside and which is a surface parallel to the XY' plane and may be the m-surface of a crystalline quartz crystal which is exposed to the outside and which has an uneven surface associated with crystalline anisotropy of a quartz crystal. In the description of the invention, the side surface having an uneven surface associated with the m-surface of the crystalline quartz crystal is also referred to as "being in one plane". For the sake of convenience, illustration of an uneven surface associated with the m-surface is omitted in FIGS. 1 and 2. In addition, only the R-surface of a crystalline quartz crystal may be exposed to the outside by processing an AT-cut quartz crystal substrate using a laser.

The side surfaces 14c and 14d extending in the Z'-axis direction have a step as shown in FIG. 3. The excitation portion 14 has a first portion 15 and second portions 16 having a smaller thickness than the first portion 15. The steps of the side surfaces 14c and 14d are formed by a difference in the thickness of the first and second portions 15 and 16. In the example shown, the side surfaces 14c and 14d are configured to include a surface parallel to the Y'Z' plane of the first portion 15, a surface parallel to the XZ' plane of the second portions 16, and a surface parallel to the Y'Z' plane of the second portions 16.

As shown in FIGS. 1 and 3, for example, the second portions 16 are formed so as to interpose the first portion 15 in the X-axis direction. Thus, as shown in FIG. 2, the side surfaces 14a and 14b extending in the X-axis direction are formed by the side surfaces of the first portion 15. As above, the excitation portion 14 has two portions 15 and 16 having different thicknesses, and the piezoelectric resonator element 100 can be said to have a two-step type mesa structure.

The excitation portion 14 can vibrate in a thickness-shear mode as its primary vibration mode. Since the excitation portion 14 has a two-step type mesa structure, the piezoelectric resonator element 100 can have an energy trapping effect.

Here, when the length (short side length) in the Z'-axis direction of the piezoelectric substrate 10 is Z, the short side length of the excitation portion 14 is Mz, and the thickness (thickness of the first portion 15 of the excitation portion 14)

of the excitation portion 14 is t, it is preferable to satisfy a relation of Expression (1) below.

$$8 \leq Z/t \leq 11, \text{ and } 0.6 \leq Mz/Z \leq 0.8 \quad (1)$$

By doing so, it is possible to suppress coupling of the thickness-shear mode and a spurious mode such as a contour vibration mode and to further decrease the CI value (details will be described later). The coupling of the thickness-shear mode and the spurious mode is generally likely to occur as the size of the piezoelectric resonator element decreases. Thus, coupling of the thickness-shear mode and the spurious mode can be suppressed more remarkably when the piezoelectric resonator element 100 having such a small size so as to satisfy a relation of Expression (2) below is designed so as to satisfy the relation of Expression (1) above, for example.

$$X/t \leq 17 \quad (2)$$

In Expression (2) above, X is the length (long side length) in the X-axis direction of the piezoelectric substrate 10.

The excitation electrodes 20 are formed in the excitation portion 14. In the example shown in FIGS. 2 and 3, the excitation electrodes 20 are formed so as to interpose the excitation portion 14. More specifically, the excitation electrodes 20 are disposed so as to face vibrating regions (the excitation portion 14) on both front and rear principal surfaces (for example, surfaces parallel to the XZ' plane) of the piezoelectric substrate 10. The excitation electrodes 20 can apply voltage to the excitation portion 14. The excitation electrodes 20 are connected to pads 24 through extraction electrodes 22, for example. The pads 24 are electrically connected to an IC chip (not shown) for driving the piezoelectric resonator element 100, for example. As the material of the excitation electrodes 20, the extraction electrodes 22, and the pads 24, a material in which chromium and gold are laminated in that order from the side of the piezoelectric substrate 10 can be used.

The piezoelectric resonator element 100 according to the present embodiment has the following characteristics, for example.

According to the piezoelectric resonator element 100, each of the side surfaces 14a and 14b extending in the X-axis direction of the excitation portion 14 is present in one plane, and each of the side surfaces 14c and 14d extending in the Z'-axis direction of the excitation portion 14 has a step. With this configuration, it is possible to decrease the CI value more effectively than a piezoelectric resonator element (see FIGS. 16A and 16B described later) in which each of the side surfaces extending in the X-axis direction of the excitation portion 14 is not present in one plane (details will be described later).

According to the piezoelectric resonator element 100, as described above, it is possible to further decrease the CI value by designing the short side length Z of the piezoelectric substrate 10, the short side length Mz of the excitation portion 14, and the thickness t of the excitation portion 14 so as to satisfy the relation of Expression (1).

According to the piezoelectric resonator element 100, as described above, it is possible to decrease the CI value while realizing miniaturization by designing the X-side ratio (X/t) so as to satisfy the relation of Expression (2).

2. Method of Manufacturing Piezoelectric Resonator Element

Next, a method of manufacturing the piezoelectric resonator element according to the present embodiment will be described with reference to the relevant drawings. FIGS. 5A to 5C to FIGS. 11A to 11C are views schematically showing the processes of manufacturing the piezoelectric resonator element 100 according to the present embodiment. In FIGS. 5A to 5C to FIGS. 11A to 11C, FIGS. 5A to 11A are planar views, FIGS. 5B to 11B are cross-sectional views taken along the lines B-B in FIGS. 5A to 11A, and FIGS. 5C to 11C are cross-sectional views taken along the lines C-C.

Figure 5A:
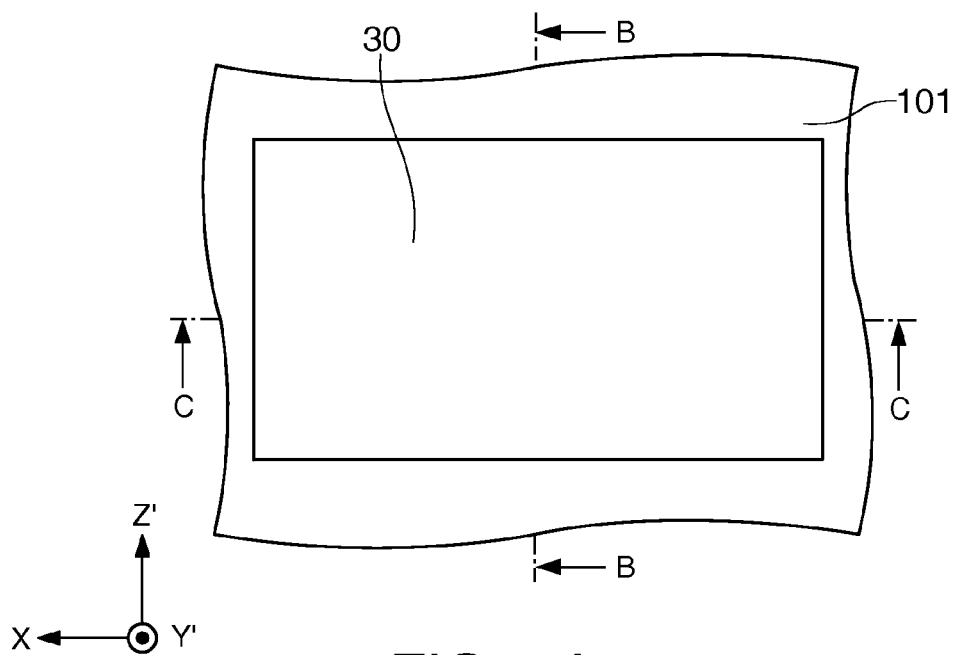
FIGS. 5A to 5C are a planar view and cross-sectional views schematically showing a method of manufacturing the piezoelectric resonator element according to the embodiment.
Figure 5B:
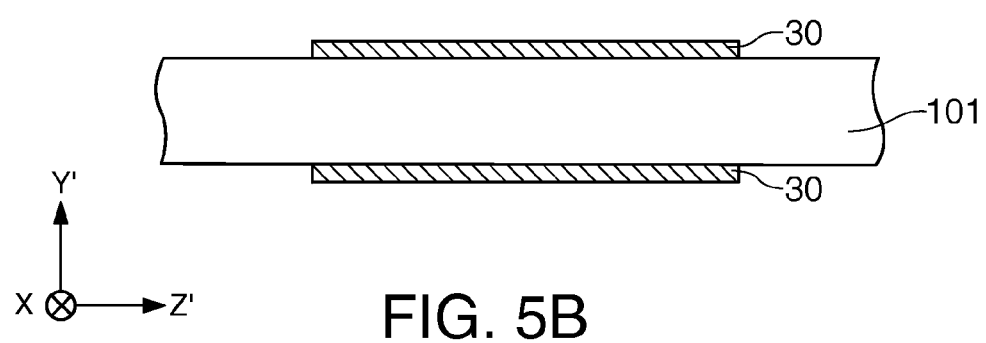
Figure 5C:
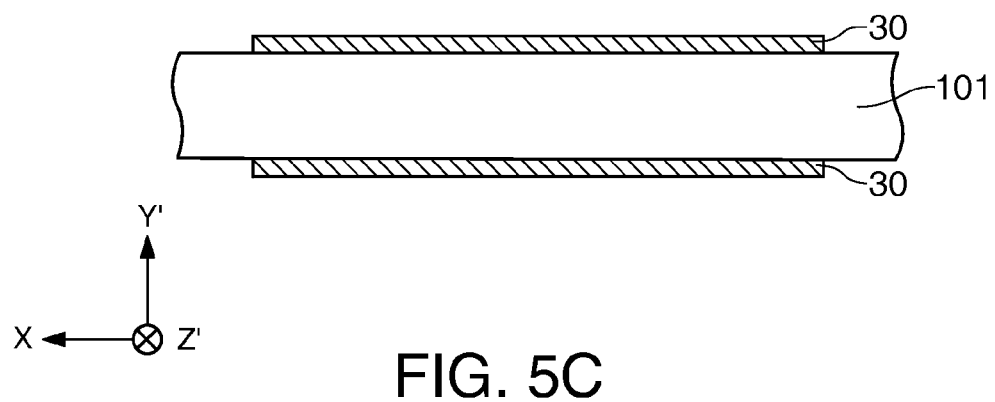

As shown in FIGS. 5A to 5C, an anticorrosive film 30 is formed on the front and rear principal surfaces (surfaces parallel to the XZ' plane) of the AT-cut quartz crystal substrate 101. The anticorrosive film 30 is formed by laminating chromium and gold in that order using a sputtering method or a vacuum deposition method, for example and then patterning the chromium-gold laminate. The patterning is performed by lithography and etching techniques, for example. The anticorrosive film 30 has anticorrosive properties to a solution containing a hydrofluoric acid serving as an etching solution when processing the AT-cut quartz crystal substrate 101.

Figure 6A:
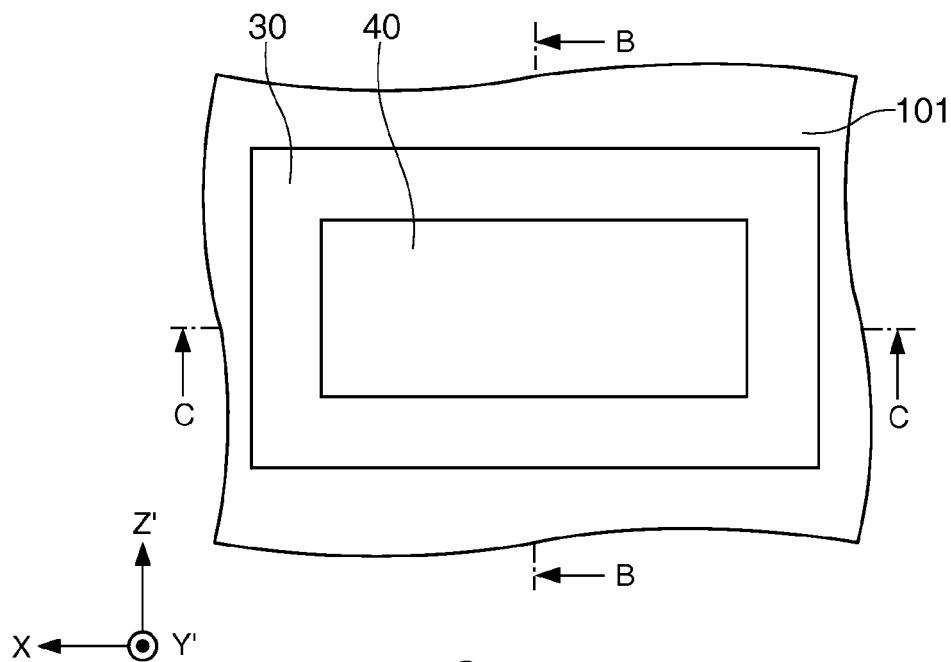
FIGS. 6A to 6C are a planar view and cross-sectional views schematically showing a method of manufacturing the piezoelectric resonator element according to the embodiment.
Figure 6B:
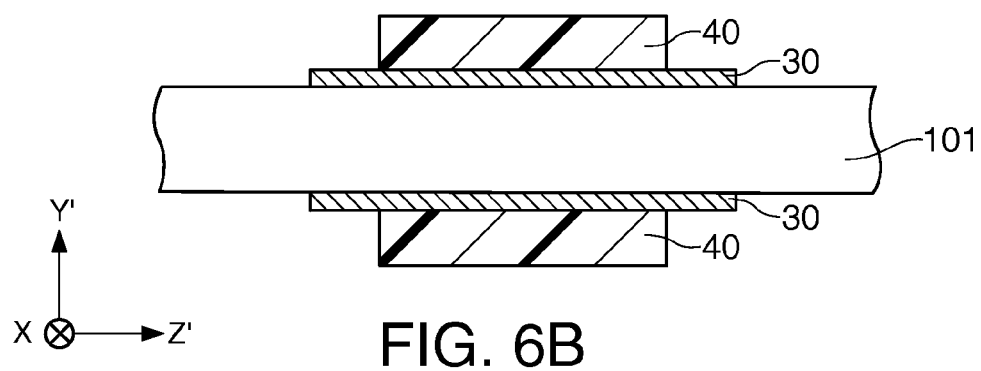
Figure 6C:
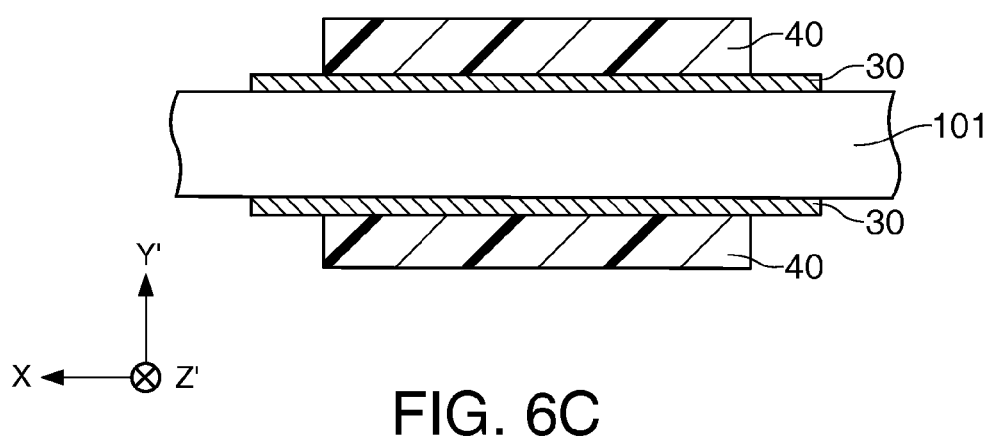

Subsequently, as shown in FIGS. 6A to 6C, after applying a positive photoresist film, the photoresist film is subjected to exposure and development to thereby form a resist film 40 having a predetermined shape. The resist film 40 is formed so as to cover a portion of the anticorrosive film 30.

Figure 7A:
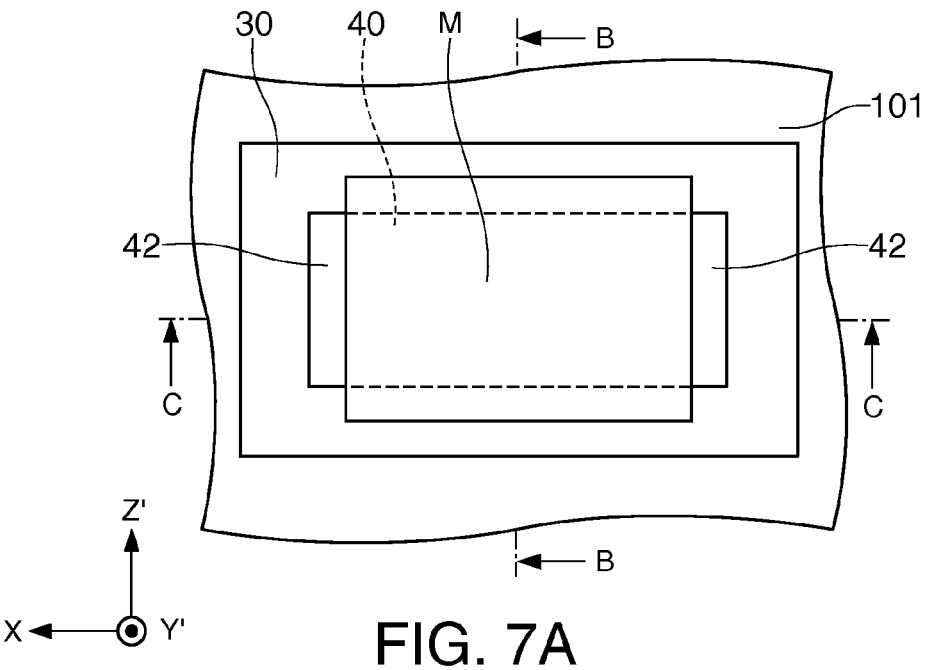
FIGS. 7A to 7C are a planar view and cross-sectional views schematically showing a method of manufacturing the piezoelectric resonator element according to the embodiment.
Figure 7B:
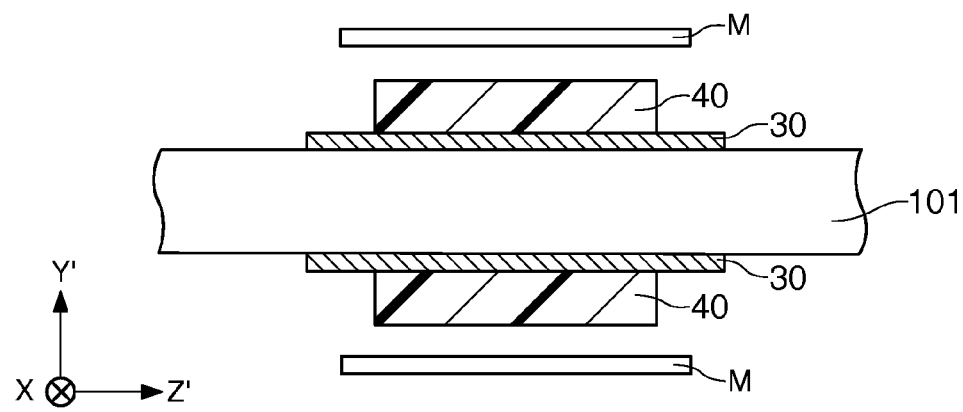
Figure 7C:
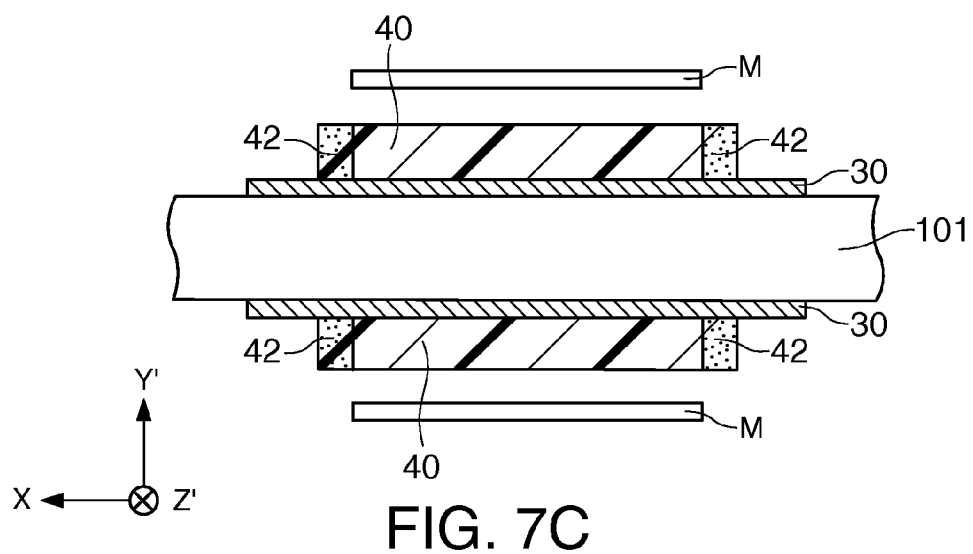

Subsequently, as shown in FIGS. 7A to 7C, a portion of the resist film 40 is subjected to exposure again using a mask M to thereby form a photosensitive portion 42. The mask M is disposed so as to cross the resist film 40 as viewed from the Y'-axis direction as shown in FIG. 7A. That is, the length in the X-axis direction of the mask M is smaller than the length in the X-axis direction of the resist film 40, and the length in the Z'-axis direction of the mask M is larger than the length in the Z'-axis direction of the resist film 40. By performing exposure using such a mask M, it is possible to form the photosensitive portion 42 on both sides of the resist film 40 as viewed from the Z'-axis direction as shown in FIG. 7C.

Figure 8A:
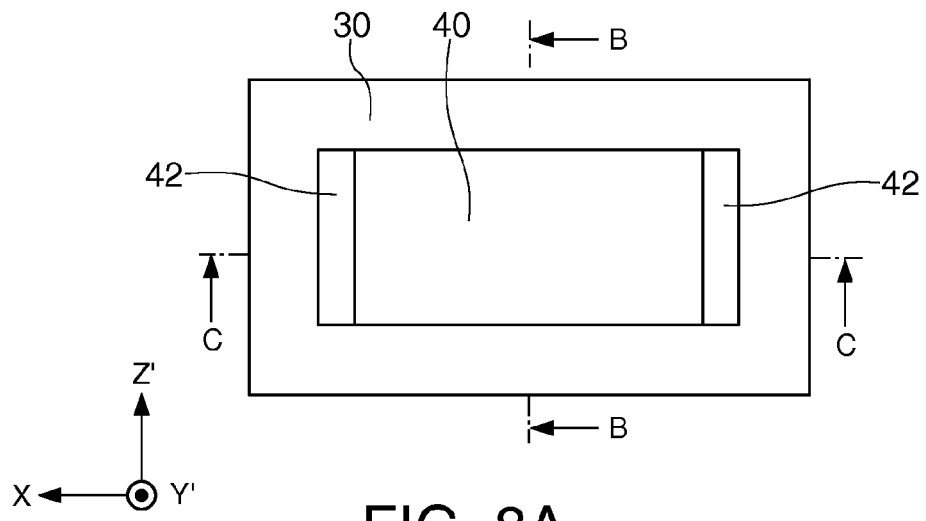
FIGS. 8A to 8C are a planar view and cross-sectional views schematically showing a method of manufacturing the piezoelectric resonator element according to the embodiment.
Figure 8B:
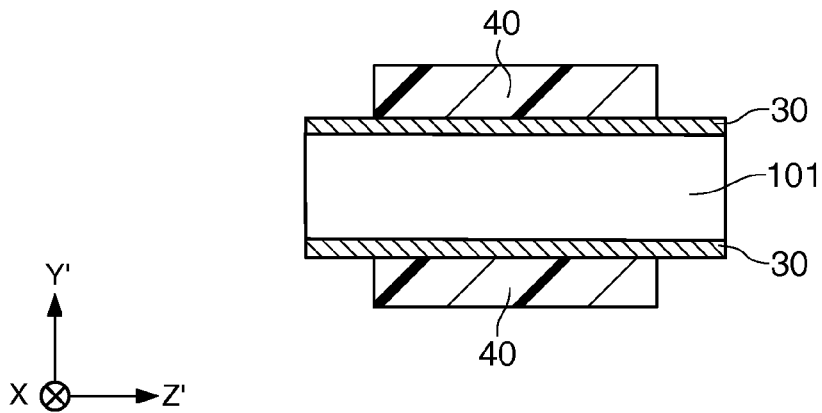
Figure 8C:
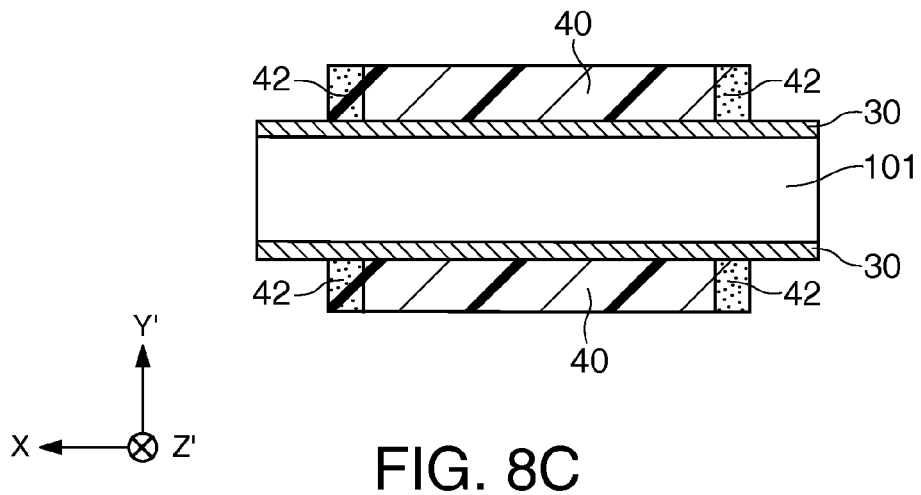

Subsequently, as shown in FIGS. 8A to 8C, the AT-cut quartz crystal substrate 101 is etched using the anticorrosive film 30 as a mask. The etching is performed using a mixed solution of a hydrofluoric acid and ammonium fluoride as an etching solution, for example. In this way, the outer shape of the piezoelectric substrate 10 (as viewed from the Y'-axis direction) is formed.

Figure 9A:
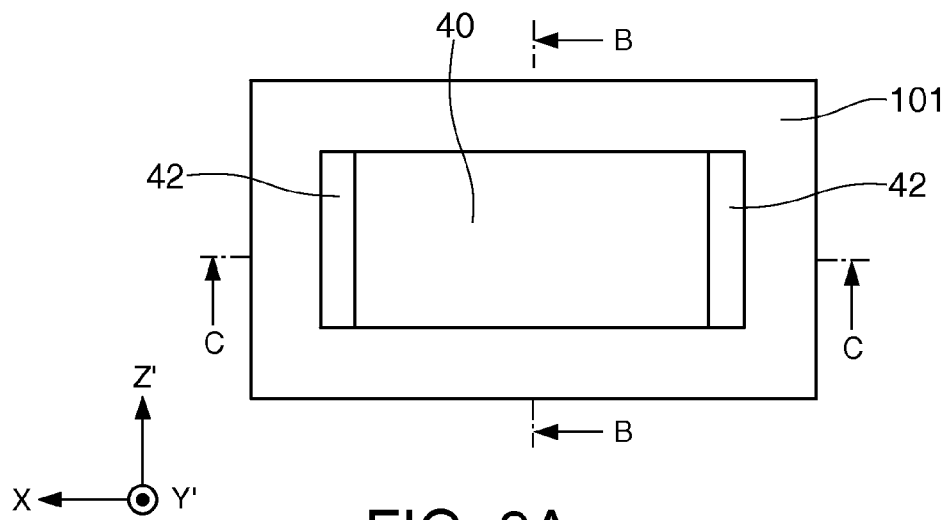
FIGS. 9A to 9C are a planar view and cross-sectional views schematically showing a method of manufacturing the piezoelectric resonator element according to the embodiment.
Figure 9B:
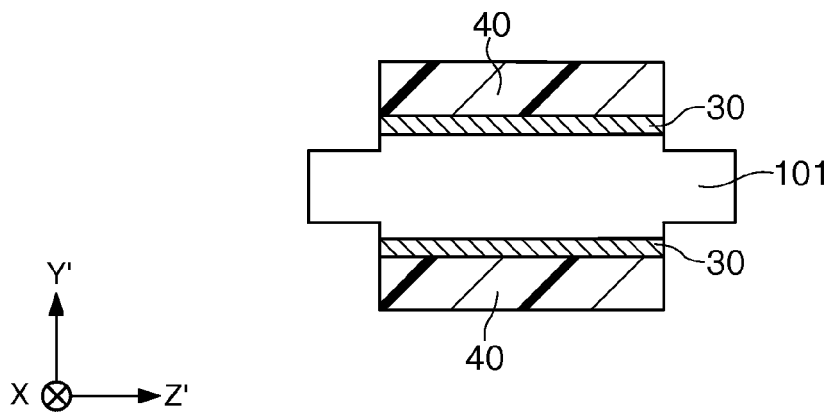
Figure 9C:
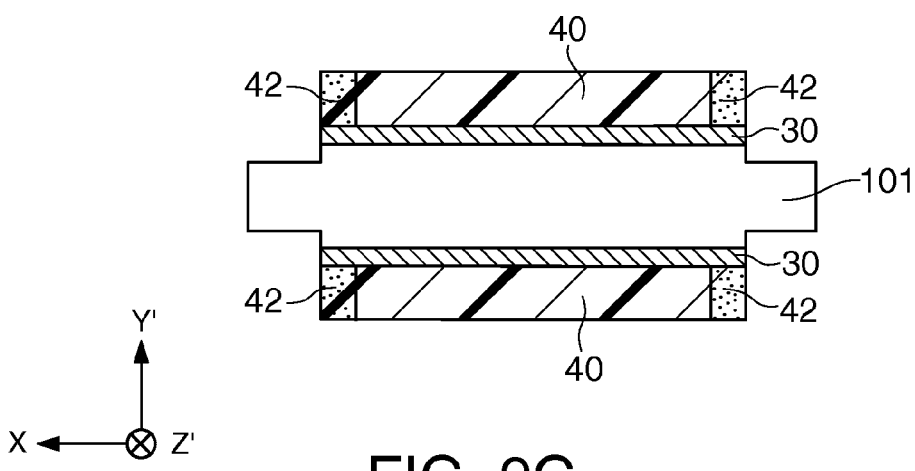

Subsequently, as shown in FIGS. 9A to 9C, the anticorrosive film 30 is etched by a predetermined etching solution using the resist film 40 as a mask, and then, the AT-cut quartz crystal substrate 101 is half-etched to a predetermined depth using the mixed solution described above as an etching solution. In this way, the outer shape of the excitation portion 14 is formed.

Figure 10A:
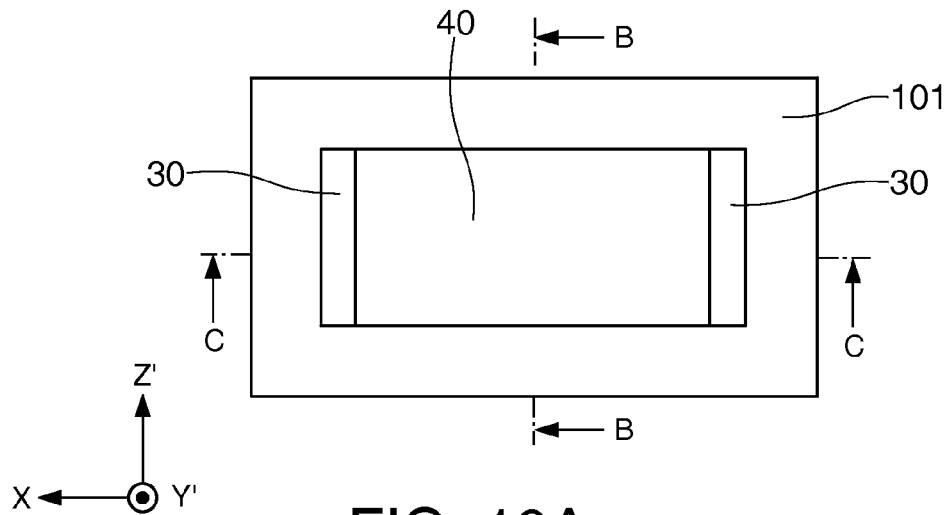
FIGS. 10A to 10C are a planar view and cross-sectional views schematically showing a method of manufacturing the piezoelectric resonator element according to the embodiment.
Figure 10B:
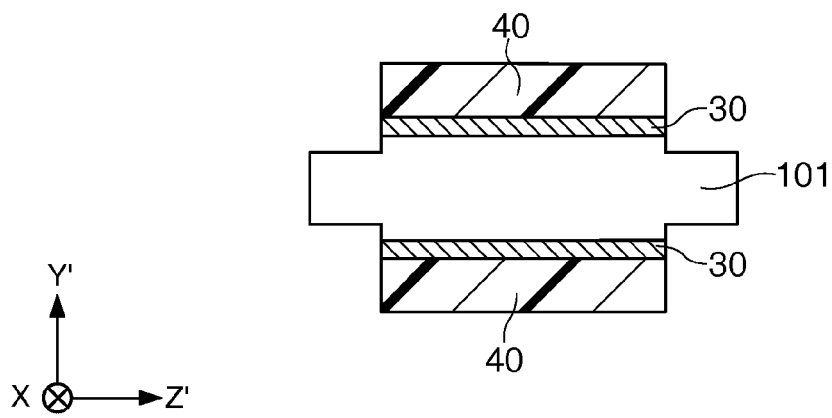
Figure 10C:
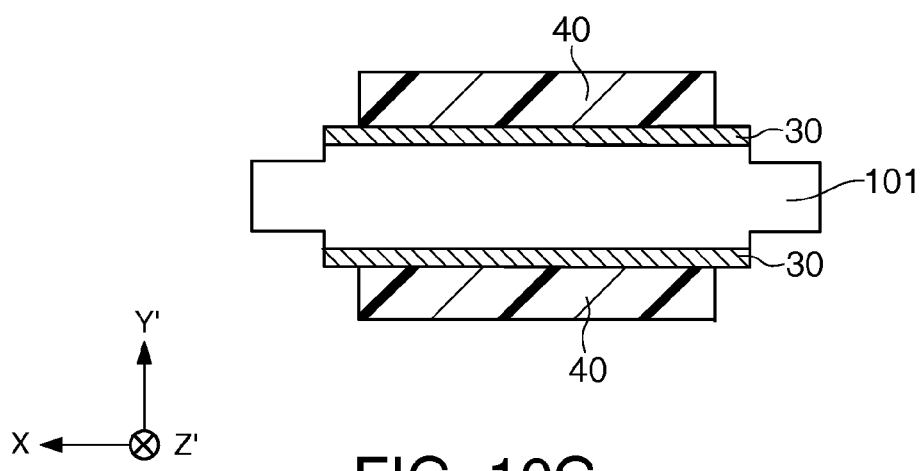

Subsequently, as shown in FIGS. 10A to 10C, the photosensitive portion 42 of the resist film 40 is developed and removed. In this way, a portion of the anticorrosive film 30 is exposed to the outside. In addition, before developing the photosensitive portion 42, an affected layer (not shown) formed on the surface of the resist film 40 is ashed by oxygen plasma generated by electric discharge under a vacuum or a low-pressure atmosphere, for example. In this way, it is possible to reliably develop and remove the photosensitive portion 42.

Figure 11A:
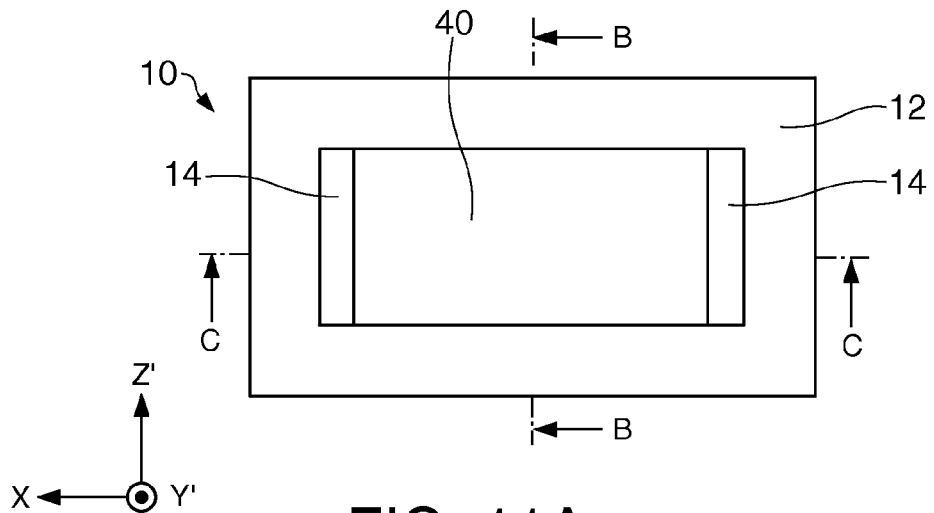
FIGS. 11A to 11C are a planar view and cross-sectional views schematically showing a method of manufacturing the piezoelectric resonator element according to the embodiment.
Figure 11B:
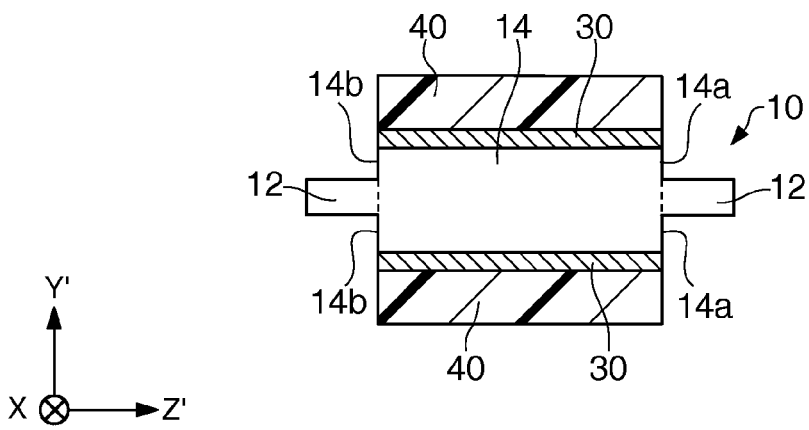
Figure 11C:
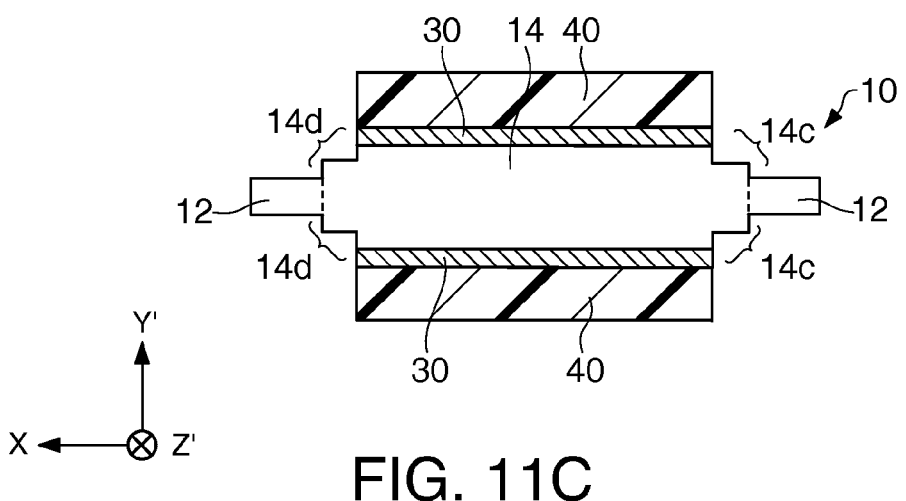

Subsequently, as shown in FIGS. 11A to 11C, the anticorrosive film 30 is etched by a predetermined etching solution using the resist film 40 as a mask, and then, the AT-cut quartz crystal substrate 101 is half-etched to a predetermined thickness using the mixed solution described above as an etching solution. In this way, it is possible to form each of the side surfaces 14a and 14b extending in the X-axis direction in one plane. Moreover, it is possible to form a step in each of the side surfaces 14c and 14d extending in the Z'-axis direction.

Through the above processes, it is possible to form the piezoelectric substrate 10 having the peripheral portion 12 and the excitation portion 14.

As shown in FIGS. 1 to 3, after removing the resist film 40 and the anticorrosive film 30, the excitation electrodes 20, the extraction electrodes 22, and the pads 24 are formed on the piezoelectric substrate 10. The excitation electrodes 20, the extraction electrodes 22, and the pads 24 are formed by laminating chromium and gold in that order using a sputtering method or a vacuum deposition method, for example, and patterning the chromium-gold laminate.

Through the above processes, it is possible to manufacture the piezoelectric resonator element 100 according to the present embodiment.

According to the method of manufacturing the piezoelectric resonator element 100, after removing the photosensitive portion 42 by developing the resist film 40 which is used in order to form the outer shape of the excitation portion 14, it is possible to cause the side surfaces 14a and 14b extending in the X-axis direction to be exposed to the outside using the resist film 40 again. Here, the length in the X-axis direction of the mask M used for forming the photosensitive portion 42 is smaller than the length of the resist film 40 and the length in the Z'-axis direction thereof is larger than the length of the resist film 40. Thus, it is possible to form each of the side surfaces 14a and 14b in one plane with high accuracy. In contrast, for example, when the resist film is applied twice in order to form the excitation portion 14 (for example, after forming the outer shape of the excitation portion using a first resist film, the first resist film is removed and a new second resist film is applied so that the side surfaces of the excitation portion are exposed to the outside), the first and second resist films may be misaligned. Thus, it may be difficult to form the side surfaces of the excitation portion in one plane. Such a problem can be solved by the method of manufacturing the piezoelectric resonator element 100.

3. Modified Example of Piezoelectric Resonator Element

Figure 12:
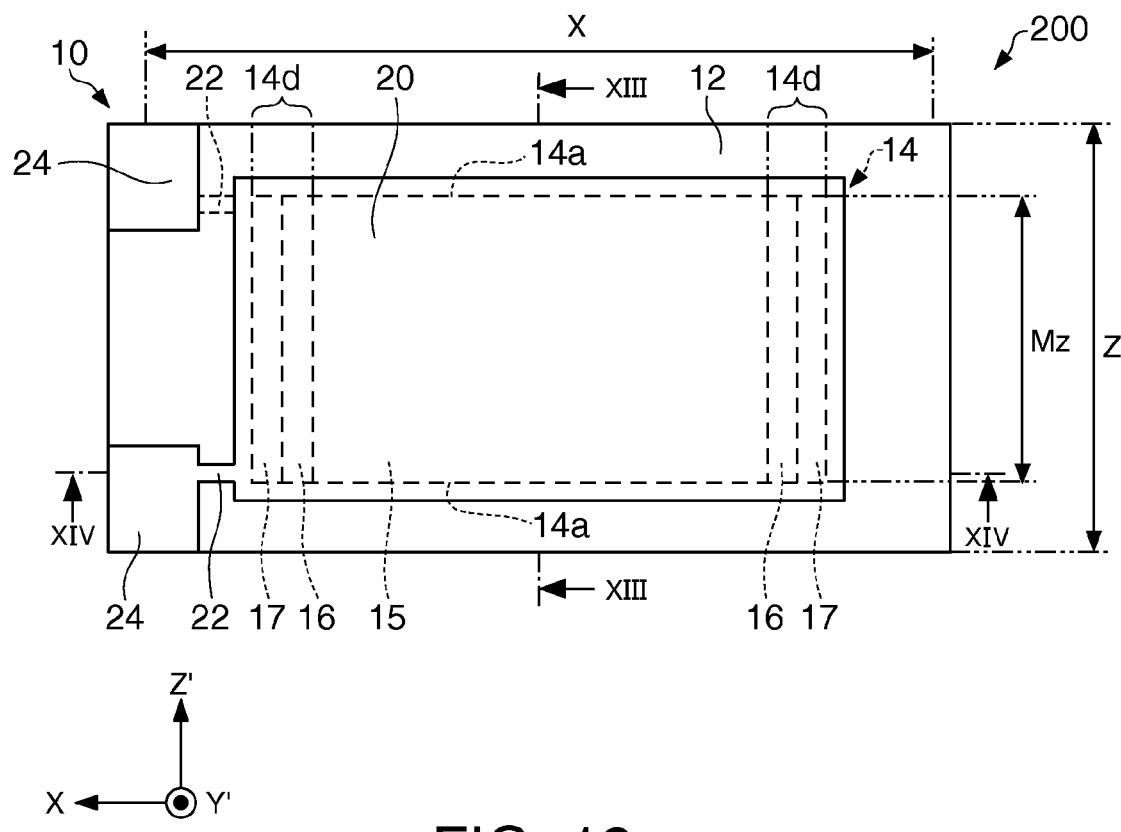
FIG. 12 is a planar view schematically showing a piezoelectric resonator element according to a modified example of the embodiment.
Figure 13:
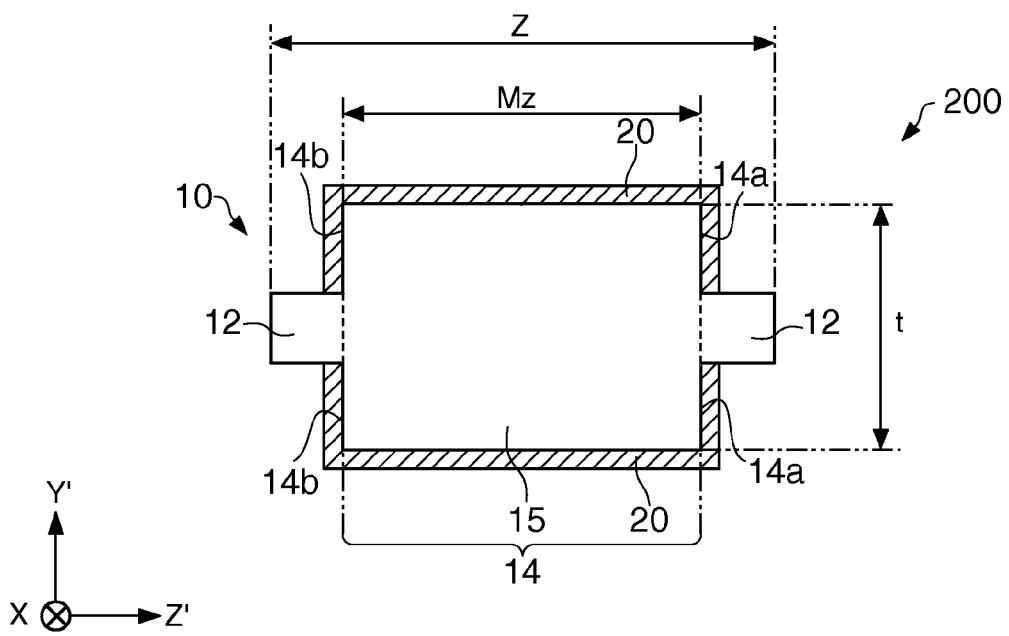
FIG. 13 is a cross-sectional view schematically showing a piezoelectric resonator element according to a modified example of the embodiment.
Figure 14:
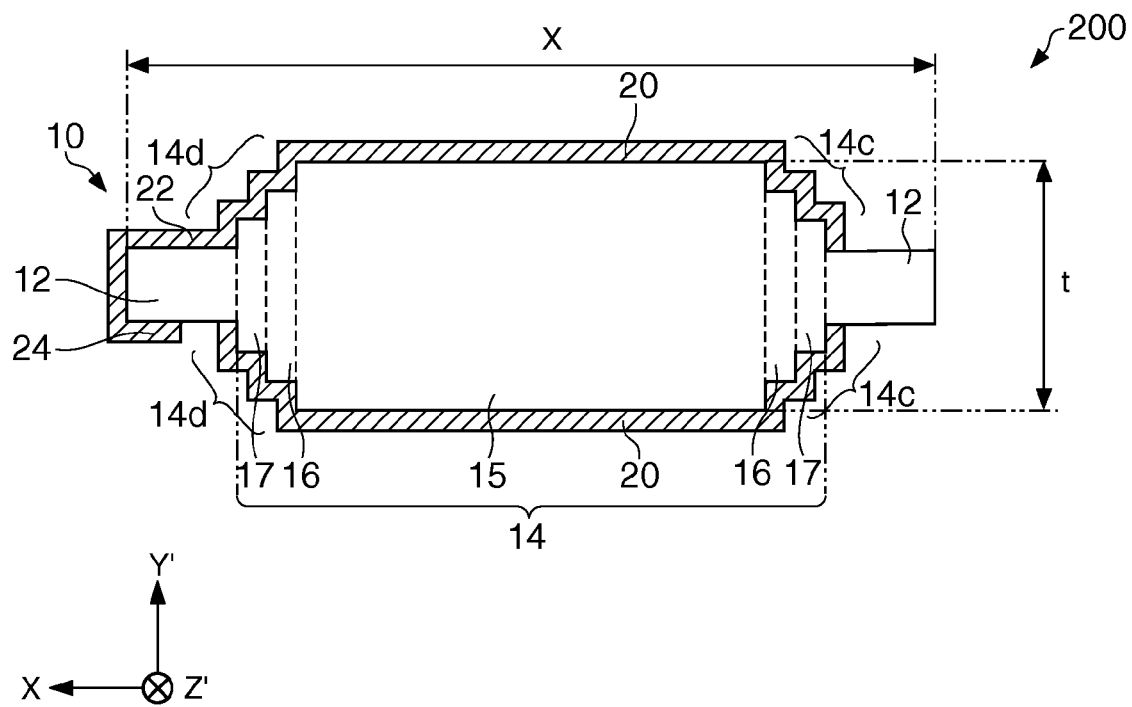
FIG. 14 is a cross-sectional view schematically showing a piezoelectric resonator element according to a modified example of the embodiment.

Next, a piezoelectric resonator element according to a modified example of the present embodiment will be described with reference to the relevant drawings. FIG. 12 is a planar view schematically showing a piezoelectric resonator element 200 according to a modified example of the present embodiment. FIGS. 13 and 14 are cross-sectional views schematically showing the piezoelectric resonator element 200 according to the modified example of the present embodiment. FIG. 13 is a cross-sectional view taken along the line XIII-XIII in FIG. 12, and FIG. 14 is a cross-sectional view taken along the line XIV-XIV in FIG. 12. In the piezoelectric resonator element 200 according to the modified example of the present embodiment, components having the same functions as the constituent components of the piezoelectric resonator element 100 according to the present embodiment will be denoted by the same reference numerals, and detailed description thereof will be omitted.

In the example of the piezoelectric resonator element 100, as shown in FIGS. 1 to 3, a two-step type mesa structure which has the first and second portions 15 and 16 having different thicknesses has been described.

In contrast, as shown in FIGS. 12 to 14, the piezoelectric resonator element 200 has a three-step type mesa structure. That is, the excitation portion 14 of the piezoelectric resonator element 200 has third portions 17 having a smaller thickness than the second portion 16 in addition to the first and second portions 15 and 16. In the example shown in FIGS. 12 and 14, the third portions 17 are formed so as to interpose the first and second portions 15 and 16 therebetween from the X-axis direction.

The steps of the side surfaces 14c and 14d extending in the Z'-axis direction are formed by a difference in the thickness of the first, second, and third portions 15, 16, and 17. In the example shown, the side surfaces 14c and 14d are configured to include a surface parallel to the Y'Z' plane of the first portion 15, a surface parallel to the XZ' plane of the second portions 16, a surface parallel to the Y'Z' plane of the second portions 16, a surface parallel to the XZ' plane of the third portions 17, and a surface parallel to the Y'Z' plane of the third portions 17.

The piezoelectric resonator element 200 can be manufactured by using the method of manufacturing the piezoelectric resonator element 100. That is, as shown in FIGS. 10A to 10C, after developing and removing the photosensitive portion 42, the resist film 40 is subjected to exposure again to thereby form a second photosensitive portion (not shown) having a predetermined shape. Subsequently, the anticorrosive film 30 and the AT-cut quartz crystal substrate 101 are etched using the resist film 40 having the second photosensitive portion as a mask. Subsequently, an affected layer of the resist film 40 is removed by performing ashing, for example, and then, the second photosensitive portion is developed and removed. Subsequently, the anticorrosive film 30 and the AT-cut quartz crystal substrate 101 are etched using the resist film 40 with the second photosensitive portion removed as a mask. Through the above processes, it is possible to form the piezoelectric resonator element 200 having a three-step type mesa structure.

According to the piezoelectric resonator element 200, it is possible to obtain a stronger energy trapping effect than the piezoelectric resonator element 100 having the two-step type mesa structure.

In the example described above, the piezoelectric resonator element 200 having the three-step type mesa structure has been described. However, in the invention, the number of steps of a multi-step type mesa structure is not particularly limited as long as each of the side surfaces extending in the X-axis direction of the excitation portion is present in one plane.

4. Piezoelectric Resonator

Figure 15:
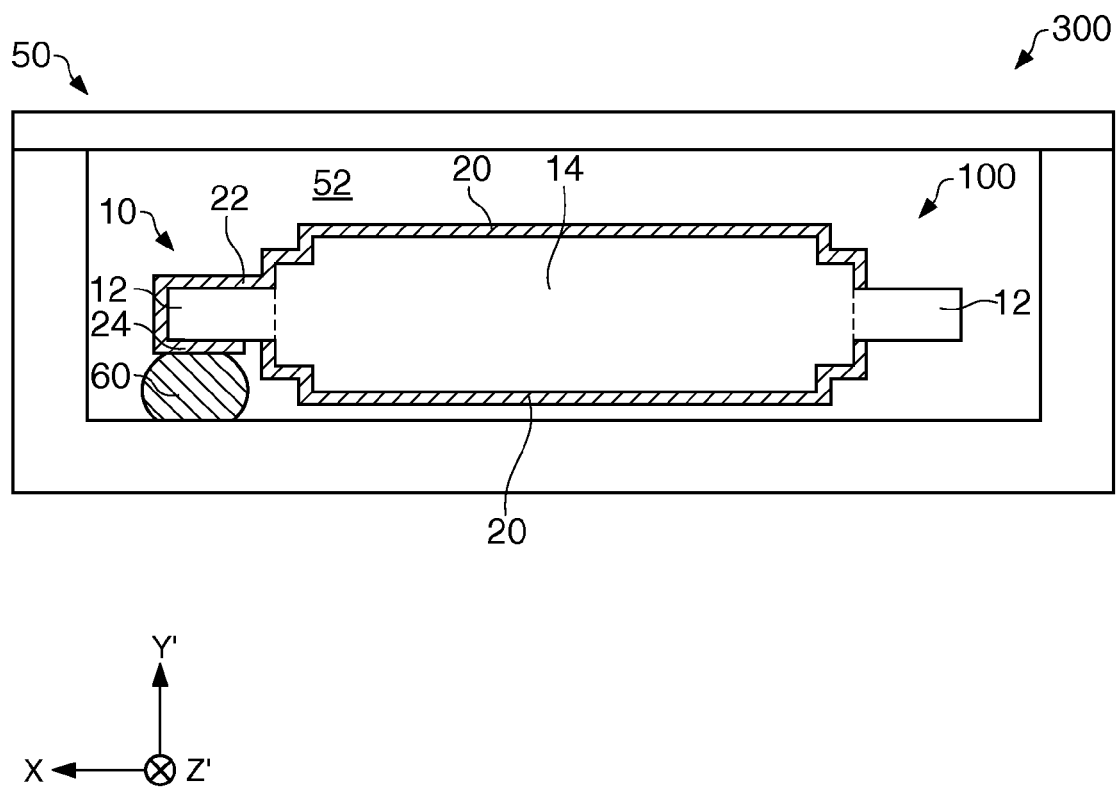
FIG. 15 is a cross-sectional view schematically showing a piezoelectric resonator according to an embodiment of the invention.

Next, a piezoelectric resonator according to the present embodiment will be described with reference to the relevant drawings. FIG. 15 is a cross-sectional view schematically showing a piezoelectric resonator 300 according to the present embodiment.

As shown in FIG. 15, the piezoelectric resonator 300 includes the piezoelectric resonator element (in the example shown, the piezoelectric resonator element 100) according to the invention and a package 50.

The package 50 can accommodate the piezoelectric resonator element 100 in a cavity 52. As the material of the package 50, ceramics and glass can be used, for example. The cavity 52 serves as a space in which the piezoelectric resonator element 100 operates. The cavity 52 is hermetically sealed and can be formed in a low-pressure space or an inert gas atmosphere.

The piezoelectric resonator element 100 is accommodated in the cavity 52 of the package 50. In the example shown, the piezoelectric resonator element 100 is fixed like a cantilevered beam within the cavity 52 by a conductive adhesive agent 60. As the conductive adhesive agent 60, a solder and a silver paste can be used, for example.

Although not shown in the drawing, an IC chip for controlling the piezoelectric resonator element 100 may be accommodated in the package 50. The IC chip may be electrically connected to the pads 24 by the conductive adhesive agent 60.

According to the piezoelectric resonator 300, since it has the piezoelectric resonator element according to the invention, it is possible to decrease the CI value.

5. Experimental Example

Hereinafter, the invention will be explained in more detail by way of experimental examples. However, the invention is not limited by the following experimental examples.

5.1. Configuration of Piezoelectric Resonator Element

As Example 1, the piezoelectric resonator element 100 having the two-step type mesa structure shown in FIGS. 1 to 3 was used. In Example 1, an AT-cut quartz crystal substrate was processed by wet-etching using a solution containing a hydrofluoric acid, whereby the piezoelectric substrate 10 having the peripheral portion 12 and the excitation portion 14 was formed. The piezoelectric substrate 10 was formed to be symmetrical with respect to a point (not shown) serving as the center of symmetry. The thickness t of the excitation portion 14 (the first portion 15) was set to 0.065 mm, and the vibration frequency was set to 24 MHz. Moreover, the long side length X of the piezoelectric substrate 10 was set to 1.1 mm (that is, the X-side ratio X/t being set to 17), the short side length Z of the piezoelectric substrate 10 was set to 0.629 mm (that is, the Z-side ratio Z/t being set to 9.7), the short side length Mz of the excitation portion 12 was set to 0.43 mm, and each of the side surfaces 14a and 14b extending in the X-axis direction was formed to be present in one plane.

Figure 16A:
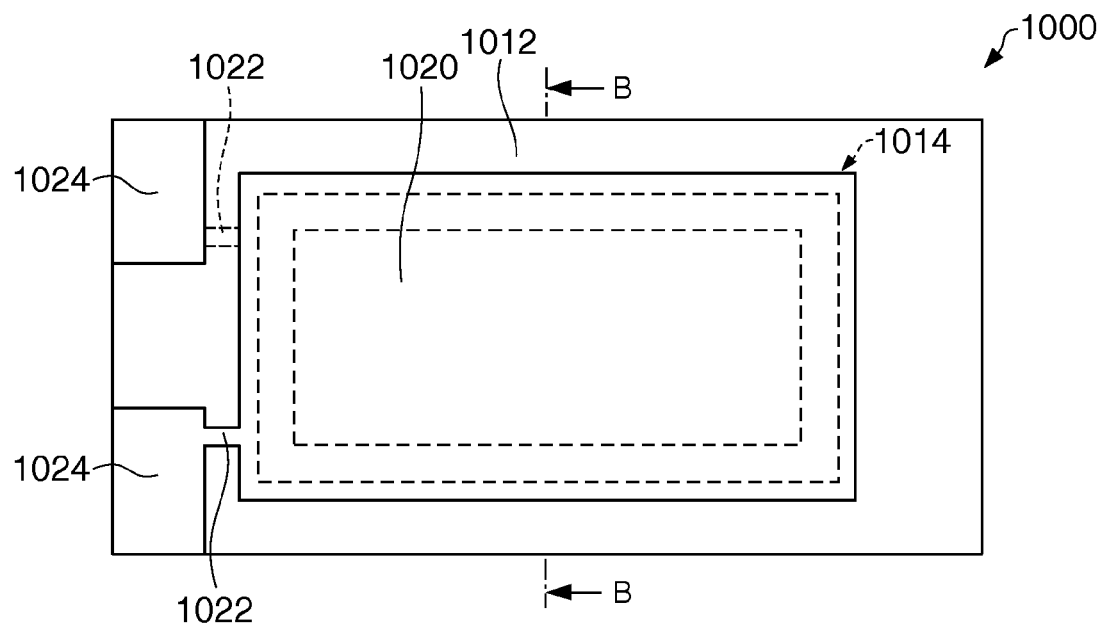
FIGS. 16A and 16B are a planar view and a cross-sectional view schematically showing a piezoelectric resonator element according to a comparative example.
Figure 16B:
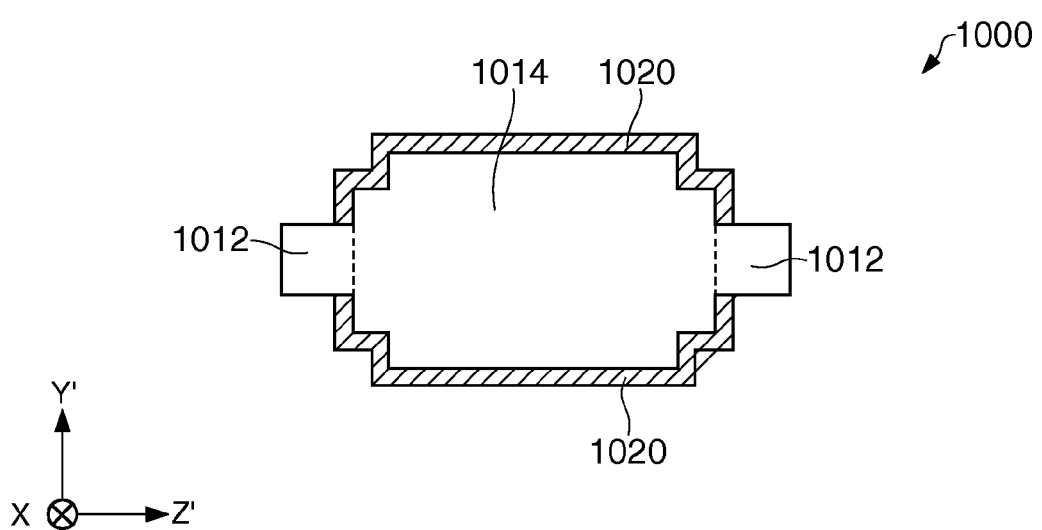

As Comparative Example 1, a piezoelectric resonator element 1000 shown in FIGS. 16A and 16B was used. In FIGS. 16A and 16B, FIG. 16B is a cross-sectional view taken along the line B-B in FIG. 16A.

In Comparative Example 1, as shown in FIG. 16B, an excitation portion 1014 was formed so as to have the same shape as the excitation portion 14 of Example 1 except that each of the side surfaces extending in the X-axis direction has a step. In addition, a peripheral portion 1012, excitation electrodes 1020, extraction electrodes 1022, and pads 1024 shown in FIGS. 16A and 16B correspond to the peripheral portion 12, the excitation electrodes 20, the extraction electrodes 22, and the pads 24 shown in FIGS. 1 to 3, respectively.

5.2. Measurement Result of Distribution of CI Value

Figure 17A:
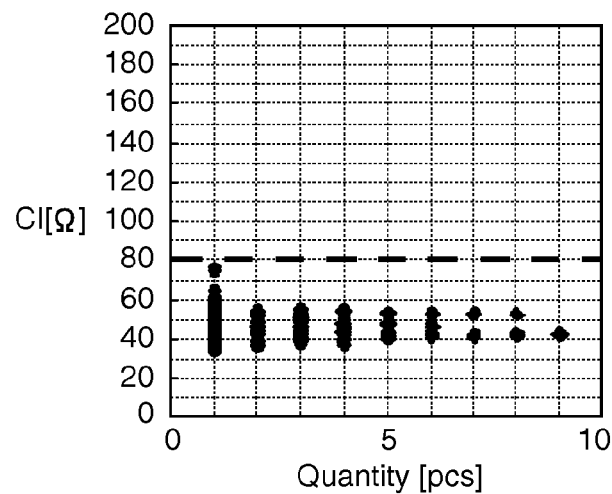
FIGS. 17A and 17B are graphs showing distribution of the CI value.
Figure 17B:
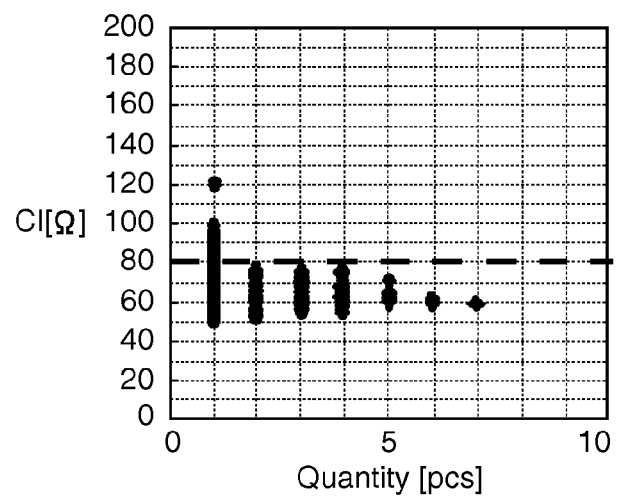

Two hundred piezoelectric resonator elements were formed each for Example 1 and Comparative Example 1 and accommodated in a package, and the CI value (at room temperature) was measured. FIGS. 17A and 17B are graphs showing the CI value in relation to the number of measured samples, in which FIG. 17A shows the measurement results for Example 1 and FIG. 17B shows the measurement results for Comparative Example 1. That is, FIGS. 17A and 17B show the distribution of the CI value of Example 1 and Comparative Example 1.

As can be understood from FIGS. 17A and 17B, the CI value was 80Ω or less for all samples of Example 1, which are lower than the CI value of Comparative Example 1. Moreover, the samples of Example 1 had a smaller fluctuation in the CI value than those of Comparative Example 1. That is, it was possible to decrease the CI value by forming each of the side surfaces extending in the X-axis direction of the excitation portion to be present in one plane. This is considered to be attributable to the fact that coupling of the thickness-shear mode and a spurious mode such as a contour vibration mode in the Z'-axis direction can be suppressed by forming each of the side surfaces extending in the X-axis direction to be present in one plane.

5.3. Evaluation of CI Value in Relation to Mz/Z

Figure 18:
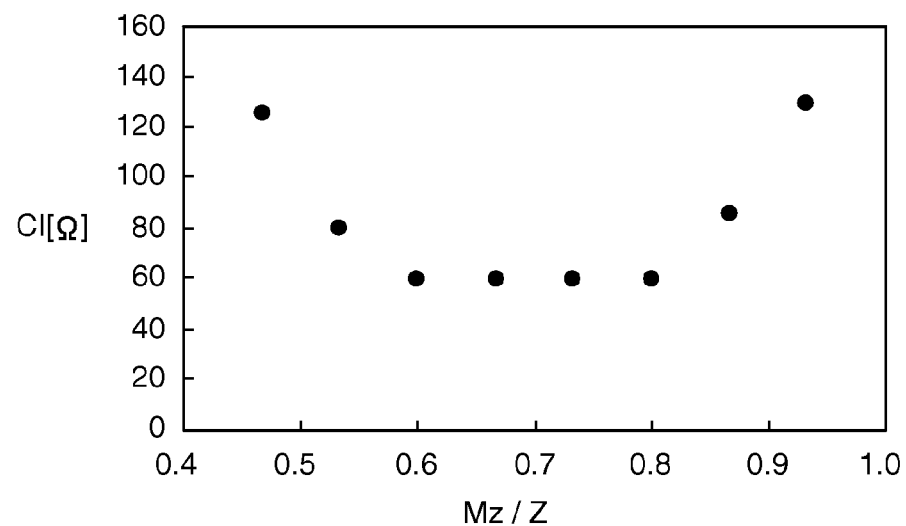
FIG. 18 is a graph showing the relationship between Mz/Z (where Mz is a short side length of an excitation portion and Z is a short side length of a piezoelectric substrate) and the CI value.

As for the piezoelectric resonator elements of Example 1, the CI value (at room temperature) was measured by fixing the thickness t of the excitation portion 14 to 0.065 mm and the short side length Mz of the excitation portion 14 to 0.43 mm while changing the short side length Z of the piezoelectric substrate 10 to 0.46 mm, 0.5 mm, 0.54 mm, 0.59 mm, 0.65 mm, 0.72 mm, 0.81 mm, and 0.92 mm. The measurement was performed in a state where the piezoelectric resonator elements were accommodated in a package. FIG. 18 is a graph showing the relationship between Mz/Z and the CI value.

It can be understood from FIG. 18 that the CI value was as low as about 60Ω when Mz/Z was in the range of 0.6 or more and 0.8 or less. In this case, Z is 0.54 mm or more and 0.72 mm or less, and the Z-side ratio (Z/t) is 8 or more and 11 or less. From the above, it can be understood that it is possible to decrease the CI value by setting the Z-side ratio (Z/t) to be in the range of $8 \leq Z/t \leq 11$ and Mz/Z to be in the range of $0.6 \leq Mz/Z \leq 0.8$ (that is, so as to satisfy the relation of Expression (1)). This is considered to be attributable to the fact that coupling of the thickness-shear mode and a spurious mode such as a contour vibration mode in the Z'-axis direction can be suppressed further by designing Z/t and Mz/Z so as to satisfy the relation of Expression (1).

In addition, as for a piezoelectric resonator element in which Mz was set to 0.4 mm and Z was set to 0.65 mm (that is, Mz/Z=0.6) and a piezoelectric resonator element in which Mz was set to 0.48 mm and Z was set to 0.6 mm (that is, Mz/Z=0.8), the CI value was also measured, which was about 60Ω for both. From the above, it can be said that the CI value can be decreased as long as the relation of Expression (1) is satisfied without being limited to the case of Mz=0.43 mm.

In the above experimental examples, the piezoelectric resonator element having the two-step type mesa structure shown in FIGS. 1 to 3 has been used. However, the experimental results can be applied to piezoelectric resonator elements having a multi-step type mesa structure as shown in FIGS. 12 to 14.

The invention is not limited to the above-mentioned embodiment, and various modifications can be made. For example, the invention includes substantially the same configuration (for example, a configuration having the same function, method, and results or a configuration having the same object and advantage) as the configuration described in the embodiment. Moreover, the invention includes a configuration in which an unessential portion of the configuration described in the embodiment is replaced by another. Furthermore, the invention includes a configuration in which the same operation and advantage as the configuration described in the embodiment are exhibited or the same object can be achieved. Furthermore, the invention includes a configuration in which a known technique is added to the configuration described in the embodiment.

What is claimed is:

1. A piezoelectric resonator element comprising:
   a piezoelectric substrate formed of an AT-cut quartz crystal substrate in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a −Y direction of the Y axis about the X axis is a Z' axis, and an axis which is the Y axis tilted in a +Z direction of the Z axis about the X axis is a Y' axis, in which the AT-cut quartz crystal substrate is configured by a plane parallel to the X axis and the Z' axis, and the thickness direction thereof is a direction parallel to the Y' axis; and excitation electrodes disposed so as to face vibrating regions on both front and rear principal surfaces of the piezoelectric substrate, wherein the piezoelectric substrate includes an excitation portion that is configured with sides parallel to the X axis and sides parallel to the Z' axis; and a peripheral portion having a smaller thickness than the excitation portion and formed around the sides of the excitation portion, the excitation portion includes multiple steps placed between the peripheral portion and a center of the excitation portion extending in a direction parallel to the X axis, and the excitation portion includes a single step placed between the peripheral portion and the center of the excitation portion extending in a direction parallel to the Z' axis.

2. The piezoelectric resonator element according to claim 1, wherein the multiple steps extend between both ends of the sides parallel to the Z' axis.

3. The piezoelectric resonator element according to claim 1, wherein the single step extends between both ends of the sides parallel to the X axis.

4. The piezoelectric resonator element according to claim 1, wherein the excitation portion includes two steps placed between the peripheral portion and the center of the excitation portion extending in the direction parallel to the X axis.

5. The piezoelectric resonator element according to claim 4, wherein the two steps extend between both ends of the sides parallel to the Z' axis.

6. The piezoelectric resonator element according to claim 1, wherein the excitation portion includes three steps placed between the peripheral portion and the center of the excitation portion extending in the direction parallel to the X axis.

7. The piezoelectric resonator element according to claim 6, wherein the three steps extend between both ends of the sides parallel to the Z' axis.

8. The piezoelectric resonator element according to claim 1, wherein the sides parallel to the X axis of the excitation portion are longer than the sides parallel to the Z' axis of the excitation portion.

9. The piezoelectric resonator element according to claim 8, wherein when a length of the piezoelectric substrate in a direction parallel to the Z' axis is Z, a side length of the sides parallel to the Z' axis of the excitation portion is Mz, and a thickness of the excitation portion is t, a relation of $8 \leq Z/t \leq 11$ and $0.6 \leq Mz/Z \leq 0.8$ is satisfied.

10. The piezoelectric resonator element according to claim 9, wherein the excitation portion includes two steps placed between the peripheral portion and the center of the excitation portion extending in the direction parallel to the X axis.

11. The piezoelectric resonator element according to claim 10, wherein the two steps extend between both ends of the sides parallel to the Z' axis.

12. The piezoelectric resonator element according to claim 9, wherein when a length of the piezoelectric substrate in a direction parallel to the X axis is X, a relation of $X/t \leq 17$ is satisfied.

13. The piezoelectric resonator element according to claim 12, wherein the excitation portion includes two steps placed between the peripheral portion and the center of the excitation portion extending in the direction parallel to the X axis.

14. The piezoelectric resonator element according to claim 13, wherein the two steps extend between both ends of the sides parallel to the Z' axis.

15. A piezoelectric resonator comprising:

the piezoelectric resonator element according to claim 1; and a package in which the piezoelectric resonator element is accommodated.

16. A piezoelectric resonator comprising:

the piezoelectric resonator element according to claim 2; and a package in which the piezoelectric resonator element is accommodated.

17. A piezoelectric resonator comprising:

the piezoelectric resonator element according to claim 4; and a package in which the piezoelectric resonator element is accommodated.

18. A piezoelectric resonator comprising:

the piezoelectric resonator element according to claim 6; and a package in which the piezoelectric resonator element is accommodated.

19. A piezoelectric resonator comprising:

the piezoelectric resonator element according to claim 9; and a package in which the piezoelectric resonator element is accommodated.

20. A piezoelectric resonator comprising:

the piezoelectric resonator element according to claim 12; and a package in which the piezoelectric resonator element is accommodated.

* * * * *